United States Patent [19]

Iwata et al.

[11] Patent Number: 4,939,119

[45] Date of Patent: Jul. 3, 1990

[54] PROCESS FOR PRODUCING A SUPERCONDUCTING ARTICLE

[75] Inventors: Kouichi Iwata; Hiroyuki Fujikawa; Shuji Yazu; Tetsuji Jodai, all of Hyogo, Japan

[73] Assignee: Sumitomo Electric Industries, Inc., Osaka, Japan

[21] Appl. No.: 184,962

[22] Filed: Apr. 22, 1988

[30] Foreign Application Priority Data

Apr. 22, 1987 [JP] Japan .................................. 62-99388
Apr. 22, 1987 [JP] Japan .................................. 62-99389
Apr. 22, 1987 [JP] Japan .................................. 62-99390
Jul. 10, 1987 [JP] Japan .................................. 62-172694
Apr. 20, 1988 [JP] Japan .................................. 63-97564

[51] Int. Cl.$^5$ .............................................. C25D 13/00
[52] U.S. Cl. .......................................... 505/1; 204/22; 204/38.4; 204/27
[58] Field of Search ............... 505/1; 204/22, 27, 38.4

[56] References Cited

U.S. PATENT DOCUMENTS 3,932,315 1/1976 Sleight ................................ 252/521
4,810,339 3/1989 Heavens .......................... 204/180.1

FOREIGN PATENT DOCUMENTS 60-173885 9/1985 Japan .

OTHER PUBLICATIONS

An Epoch Making Superconducting Material, Y. Shimbun, Feb. 16, 1987, evening edition (translation provided).
Possible High To Superconductivity in the Ba–La–Cu–O System J. G. Bednorz et al., Z. Phys. B.-Condensed Matter 64, 189–193 (1986).

Primary Examiner—John F. Niebling
Assistant Examiner—Isabelle Rodriguez
Attorney, Agent, or Firm—Kerkam, Stowell, Kondracki & Clarke

[57] ABSTRACT

A process for producing a superconducting article having a layer of compound oxide of quasi-perovskite type oxide crystal structure by electrodeposition technique. The process is characterized by dispersing a material powder in a liquid containing a carrier, driving ionized material particles towards a substrate by applying a direct current between a substrate and a counter electrode, and then sintering a thin layer of powders deposited on the substrate to convert the deposited powders to a superconducting compound oxide.

60 Claims, No Drawings

PROCESS FOR PRODUCING A SUPERCONDUCTING ARTICLE

BACKGROUND OF THE INVENTION

1. Field of the Invention

The present invention relates to a process for producing a superconducting article and more particularly, it relates to a novel process for producing a superconducting article which yields useful superconducting materials composed of compound oxides which exhibit higher critical temperatures of superconductivity such as Ba-Y-Cu type, Ba-La-Cu type, Sr-La-Cu type, Ca-Sr-Bi-Cu type or Tl-Ba-Ca-Cu type.

2. Description of the Related Art

In a superconducting condition, perfect diamagnetism is observed in a material and no difference in potential is observed and an electric current of a constant finite value is observed internally, and hence, a variety of applications of superconductivity have been proposed in a field of electric power transmission as a means for delivering electric power without loss.

Superconductivity can be utilized in the field of power electric applications such as MHD power generation, power transmission, electric power reservation or the like; in the field of transportation such as magnetic levitation trains or magnetically propelling ships; in high sensitive sensors or detectors for sensing very weak magnetic field, microwave, radiant ray or the like, in the medical field such as high-energy beam radiation unit; in the field of science such as NMR or high-energy physics; or in the field of fusion power generation.

In addition to the abovementioned power electric applications, the superconducting materials can be used in the field of electronics, for example, as a Josephson device which is an indispensable switching device for realizing a high-speed computer which consumes very reduced power.

However, the use of superconductors has been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$, which showed the highest Tc could not exceed 23.2 K. at most. This means that liquidized helium (boiling point of 4.2 K.) is the only cryogen suitable for use in realizing this very low temperature of Tc. However, helium is not only a limited costly resource but also requires a large-scaled system for liquefaction. Therefore, there had been a strong demand for other superconducting materials having higher Tc. No material which exceeded the abovementioned Tc had been found in ongoing studies over the past ten years.

It has been known that certain ceramic materials of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These type of superconductors, however, possess a rather lower transition temperature of about 10 K. and hence usage of liquidized helium (boiling point of 4.2 K.) as a cryogen is indispensable to realize superconductivity.

The possibility of a new type of superconducting materials having much higher Tc was revealed by Bednorz and Muller who discovered a new oxide type superconductor in 1986 [Z. Phys. B64 (1986)189]

This new oxide type superconducting material is [La, Ba]$_2$CuO$_4$ or [La, Sr]$_2$CuO$_4$ known as the $K_2NiF_4$-type oxide having a crystal structure which is similar to known perovskite type oxide. The $K_2NiF_4$-type oxides show such higher Tc as 30 K. which is much higher than the known superconducting materials and hence it becomes possible to use liquidized hydrogen (b.p.=20.4 K.) or liquidized neon (b.p.=27.3 K.) as a cryogen which produces temperatures in the materials at which the materials exhibit superconductivity.

It was also reported in the U.S. newspapers that C. W. Chu et al discovered in the United States of America another type of superconducting material having the critical temperature of on the order of 90 K. in February 1987, and hence the possibility of the existence of high-temperature superconductors has burst on the scene.

However, the above mentioned new type superconducting materials have been studied and developed only in a form of sintered bodies as a bulk produced from powders but have not been shaped into a wire form. The reason is that the new type superconductors are ceramic materials of compound oxide which do not possess enough plasticity or process-ability in comparison with well-known metal type superconducting materials such as Ni-Ti alloy, and therefore they can not be shaped or deformed or are difficult to shape or deform into an elongated article such as a wire by conventional techniques such as wire-drawing technique (in which superconducting metal is drawn directly or in embedded condition in copper into a wire form).

Still, the above mentioned sintered ceramic materials must be shaped into an elongated structure when they are used as a superconducting wire in practice. However, the above mentioned superconducting materials obtained in a form of a sintered body are very fragile and tend to break or crack under even very weak mechanical stress. And hence, when they are shaped into a wire, special attention must be paid to their handling in order not to be broken.

A polycrystal having completely uniform crystal structure can not be obtained from particles having superconducting properties alone. Still, the phenomenon of superconductivity is apt to be easily broken in stronger magnetic fields and under the fluctuation or unhomogeneous distribution of temperature in the sintered body. Further, the abovementioned oxide type superconducting materials possess rather higher specific resistance and lower heat-conductivity above the critical temperature. Therefore, if the phenomenon of superconductivity breaks locally, the sintered body produces Joule heat caused by the superconducting current preserved therein and consequently explosive evaporation of cryogen is induced when the heated portion of the sintered body contacts with the cryogen. In order to avert this danger, in conventional metal type superconducting material, superconducting metal is shaped into a fine wire or filament a plurality of which are embedded in electroconductive metal to act as a by-pass of electric current when superconductivity break.

The oxide type superconducting materials are, however, difficult to be shaped or deformed into such filaments, because they do not have enough plasticity or processability in comparison with well-known metal type superconducting materials such as Ni-Ti alloy.

In order to realize a reliable and practical superconducting structure, it is indispensable that the structure possesses enough strength and tenacity which is sufficient to endure a bending force during usage and which also has as fine a cross sectional dimension as possible such manner that it can transmit current at higher critical current density and at higher critical temperature. However, conventional techniques generally can not produce wire shaped ceramic articles possessing satisfactory mechanical strength and tenacity as well as a higher dimensional ratio of length to cross section or produce such articles only with difficulty.

Taking the abovementioned situation into consideration, the present inventors have proposed processes for producing sintered ceramic wires having a practically usable higher dimensional ratio of length to cross section without using an organic binder which is a cause of deterioration of strength and tenacity. Such processes are disclosed in U.S. patent application Ser. No. 152,713 titled "Process for manufacturing a superconducting wire of compound oxide-type ceramic" filed in Feb. 5, 1988 and application Ser. No. 161,480 titled "Process for manufacturing a compound oxide-type superconducting wire" filed in Feb. 28, 1988 in which a metal pipe filled with material powder is subjected to plastic deformation such as by a wire-drawing technique by means of series of die and is then sintered. These solutions are themselves satisfactory but require mechanical working such as wire-drawing and hence can not be used with pre-shaped articles having relatively complicated configuration such as coils or rings.

Therefore, an object of the present invention is to overcome the abovementioned problems of the conventional technique and to provide a novel process for producing a superconducting article which has a higher Tc and higher stability as superconductor and which also has a higher degree of freedom in configuration without use any mechanical working such as wire-drawing.

SUMMARY OF THE INVENTION

The present invention provides a process for producing a superconducting article having a layer of superconducting compound oxide on a substrate, characterized by the steps comprising dispersing at least one of material powders selected from a group comprising
(i) a powder mixture consisting of elements which are constituent elements of said compound oxide;
(ii) a powder mixture of compounds each containing at least one of said constituent elements; and
(iii) a sintered powder of compound oxide prepared by sintering a powder mixture of (i) and/or (ii) and by pulverizing obtained sintered body
in a liquid in which ionizable carrier is fix on said powders, applying a direct current between said substrate and a counter electrode both of which are immersed in said liquid to deposit ionized powders on a surface of said substrate, taking said substrate having a layer of deposited powders out of said liquid, heating said substrate to remove said carrier, and then sintering said layer of powders deposited on said substrate to convert the powders to said superconducting compound oxide.

The superconducting compound oxide obtained may be of quasi-perovskite type oxide. The term of "quasi-perovskite type oxide" means any oxide that can be considered to have a crystal structure that is similar to perovskite-type oxides and may include an orthorhombically distorted perovskite or a distorted oxygen-deficient perovskite or the like.

The material powder can be any one of the abovementioned (i), (ii) and (iii) or combination thereof, but is preferably (ii) or (iii) or combinations thereof. Particularly, the sintered powder (iii) of compound oxide is prepared by sintering a powder mixture of (i) and/or (ii) and then by pulverizing a sintered body obtained. It is not only easy to control or adjust the atom ratio of constituent elements in the material powder but it is also possible to produce an improved product as a superconductor.

Each of the compounds used as the material powders (ii) is preferably an oxide powder or an carbonate powder of constituent elements of said compound oxide such as $BaCO_3$, $Y_2O_3$ or $CuO$.

An atomic ratio of elements in said material powders is preferably adjusted to the same value as an atomic ratio of constituent elements in said compound oxide to be produced. The material powders preferably have an average particle size of less than 40 $\mu m$.

The substrate may have any form of a shaped wire such as a coil and may be made of electroconductive materials such as metals including copper, silver, iron etc., carbon fiber or the like and non electroconductive materials such as ceramics such as alumina, zirconia etc., glass or the like.

The carrier which is fixed on the material powder particle may be any material which have been used in electrodeposition technique and may be preferably polycarbonic acid type resin or polyamine type resin. The carrier is removed before final sintering. The removal of the carrier is preferably performed by heating the deposited layer at a temperature ranging from 300° C. to 500° C.

Solvents or media used as the liquid containing the carrier therein by which ionized powder particles are transported by a direct current may be water but consist preferably of non aqueous solvent such as alcohols, dimethylformaldehyde (DMF), or acetonitryl (AN). The liquid is preferably shaken, vibrated, stirred, revolved or treated by ultrasonic wave during the electrodeposition to promote uniform electrophoresis of charged colloid.

The final sintering is preferably carried out at a temperature ranging from 900° C. to 1,100° C. and in an oxygen containing atmosphere. The sintering operation can be carried out also by a hot isostatic press at a temperature ranging from 200° C. to 1,100° C. under a pressure ranging from 5 to 2,000 atm, after the deposit layer is dried.

When a substrate is made of non conductive material such as alumina, it is necessary to use an intermediate layer or a buffer layer made of electroconductive material in order to make the substrate electroconductive which is indispensable to perform electrodeposition technique. It is also preferable to interpose a thin buffer layer at an interface between the substrate and the compound oxide layer deposited, even if the substrate is made of conductive material when the compound oxide layer deposited has not enough thickness. In fact, oxygen is consumed or taken away from the superconducting compound oxide layer which is obtained after or during the sintering operation because of chemical reactions which occur at the interface between the substrate and the compound oxide, if the substrate has relatively higher susceptibility to oxidation than the compound oxide. Therefore, the buffer layer made of such a material that is less oxidizable than the compound oxide is preferably interposed therebetween, particularly when the thickness of the superconductive compound layer is not thicker than about 1 mm.

The buffer layer may consists of one of metals selected from a group comprising Au, Ag and Pt and can be formed on a surface of the substrate by conventional electroless plating technique.

DESCRIPTION OF PREFERRED EMBODIMENTS

According to one preferred embodiment, the layer of the superconducting compound oxide produced according to the present invention may be a layer of a compound oxide including an element $\alpha$ selected from IIa group of the Periodic Table, an element $\beta$ selected from IIIa group of the Periodic Table and an element $\gamma$ selected from a group comprising Ia, IIb, IIIb and VIII group of the Periodic Table. Particularly, the element $\alpha$ is preferably selected from Ba, Sr and/or Ca and the element $\beta$ is preferably selected from Y, La and/or lanthanid and the element $\gamma$ is preferably Cu. Preferred oxides of combinations of these elements comprise, Ba-Y-Cu type oxide such as $YBa_2Cu_3O_{7-\delta}$, Ba-La-Cu type oxide or Sr-La-Cu type oxide such as $[La_{1-x}, Ba_x]_2CuO_{4-y}$, in which x and y are numbers which are less than 1. In case of Ba-Y-Cu type compound oxides, a proportion of from 10 to 80% of Ba may be substituted by one or two elements selected from a group comprising Mg, Ca and Sr and/or a proportion of from 10 to 80% of Y may be substituted by one or two elements selected from a group comprising La and lanthanid. If the proportions of the substituents fall outside of the abovementioned range of from 10 to 80%, no improvement of superconductivity is expected.

It is also possible to produce a compound oxide including at least two elements $\alpha 1$ and $\alpha 2$ selected from IIa group of the Periodic Table, an element $\delta$ selected from Va group of the Periodic Table and an element $\gamma$ selected from a group comprising Ia, IIb, IIIb and VIII group of the Periodic Table. Particularly, the elements $\alpha 1$ and $\alpha 2$ are preferably Sr and Ca, the element $\delta$ is preferably Bi and the element $\gamma$ is preferably Cu such as a case of Ca-Sr-Bi-Cu type oxides for example $CaSr_2BiCu_2O_{8+\delta}$.

It is also possible to produce a compound oxide including at least two elements $\alpha 1$ and $\alpha 2$ selected from IIa group of the Periodic Table, an element $\epsilon$ selected from IIIa group of the Periodic Table and an element $\gamma$ selected from a group comprising Ia, IIb, IIIb and VIII group of the Periodic Table. Particularly, the element $\alpha 1$ and $\alpha 2$ is preferably Ba and Ca, the element $\delta$ is preferably Tl and the element $\gamma$ is preferably Cu such as a case of $Tl_2BaCa_2Cu_3O$.

According to one preferred embodiment, the layer is composed of a superconducting compound oxide represented by the general formula:

$$(\alpha 1-x\beta x)\gamma yOz$$

in which $\alpha$ stands for an element selected from IIa group of the Periodic Table, $\beta$ stands for an element selected from IIIa group of the Periodic Table and $\gamma$ stands for an element selected from a group comprising Ia, IIb, IIIb and VIII group of the Periodic Table, and a small letter of "x" represents an atomic ratio of $\beta$ and is a number which satisfies a range of $0.1 \leq x \leq 0.9$ with respect to the total of $(\alpha+\beta)$ which is equal to 1, small letters of "y" and "z" represent atomic ratios of $\gamma$ and oxygen (O) respectively and satisfy ranges of $0.4 \leq y \leq 3.0$ and $1 \leq z \leq 5$ respectively.

The abovementioned superconducting article is produced by the steps comprising preparing at least one material powder selected from a group comprising (i) a powder mixture of elements $\alpha$, $\beta$ and $\gamma$;

(ii) a powder of compounds each containing at least one of said elements of $\alpha$, $\beta$ and $\gamma$; and (iii) a sintered powder of compound oxide prepared by sintering a powder mixture of (i) and/or (ii) and by pulverizing obtained sintered body, dispersing said material powder in a liquid containing ionizable carrier which is fix on said powders, applying a direct current between an electroconductive substrate and a counter electrode both of which are immersed in said liquid to deposit ionized powders on a surface of said substrate, taking said substrate out of said liquid to remove said carrier, and then sintering a layer of powders deposited on said substrate to convert the powders to said compound oxide.

The compound used as the material powders may be oxide powder and/or carbonate powder each containing at least one of said elements $\alpha$, $\beta$ and $\gamma$. An atomic ratio of the elements of $\alpha$, $\beta$ and $\gamma$ in the material powder is preferably adjusted to the same value as an atomic ratio of $\alpha$, $\beta$ and $\gamma$ in the compound oxide to be produced. The other operational conditions such as sintering temperature, sintering atmosphere etc. may be same as the abovementioned general case.

When the compound powder is used as the material powder, the material powder of compound may be prepared by the steps comprising sintering a mixture of oxide powders or carbonate powders of the elements $\alpha$, $\beta$ and $\gamma$ or/and compound oxide powders or compound carbonate powders each containing at least two of the elements $\alpha$, $\beta$ and $\gamma$ at a temperature ranging from 250° C. to 1,200° C. and then pulverizing a sintered body obtained. The sintering is preferably carried out at a temperature ranging from the upper limit which is a melting point of said compound oxide to a temperature which is 100° C. lower than said melting point.

It is preferable to use, as the liquid, non-aqueous solvent, particularly, dimethylformaldehyde (DMF), acetonitryl (AN) or alcohols. In this case it is preferable to use, as the carrier, methacryl resin type latex and to sinter the deposited layer at a temperature ranging from 600° C. which is the lower limit to a melting point of any one of said powders having the lowest melting point which is the upper limit.

According to another aspect of the present invention, there is provided a process for producing a superconducting article having a layer of compound oxide represented by the general formula:

$$(\alpha 1-x\beta x)\gamma yOz$$

in which $\alpha$ stands for an element selected from IIa group of the Periodic Table, $\beta$ stands for an element selected from IIIa group of the Periodic Table and $\gamma$ stands for an element selected from a group comprising Ia, IIb, IIIb and VIII group of the Periodic Table, and a small letter of "x" represents an atomic ratio of $\beta$ and is a number which satisfies a range of $0.1 \leq x \leq 0.9$ with respect to the total of $(\alpha+\beta)$ which is equal to 1, small letters of "y" and "z" represent atomic ratios of γ and oxygen (O) respectively and satisfy ranges of $0.4 \leq y \leq 3.0$ and $1 \leq z \leq 5$ respectively,
characterized by steps comprising preparing at least one material powder selected from a group comprising
(i) a powder mixture of elements α and β;
(ii) a powder of compounds each containing at least one of said elements of α and β; and
(iii) a sintered powder of compound oxide prepared by sintering a powder mixture of (i) and/or (ii) and by pulverizing obtained sintered body,
dispersing said material powder in a liquid containing ionizable carrier which is fix on said powders, applying a direct current between an electroconductive substrate which contains said element γ and a counter electrode both of which are immersed in said liquid to deposit ionized powders of α and β onto a surface of said substrate containing said element γ, taking the substrate out of said liquid to remove said carrier, and then sintering said layer of deposited powders to convert the powders to said compound oxide.

The element γ is preferably Cu and the substrate may be wire or shaped wire such as a coil.

The compound oxide obtained may be of quasi-perovskite type oxide and the compounds used as the material powder is an oxide powder and/or a carbonate powder of said elements α and β or/and a compound oxide powder or a compound carbonate powder containing α and β. An atomic ratio of the elements of α and β in the material powder is preferably adjusted to the same value as an atomic ratio of α and β in the compound oxide to be produced. The other operational conditions such as the average particle size, the kind of the carrier, drying temperature, sintering temperature, sintering atmosphere, etc can be similar to the above-mentioned cases.

Now, the process according to the present invention will be described with reference to illustrative Examples, but the scope of the present invention should not be limited thereto.

EXAMPLE 1

As a material powder, powders of $BaCO_3$, $Y_2(CO_3)_3$ and CuO were prepared. The material powder was mixed and kneaded with acrylamide type resin and then dispersed in water so that the powders surrounded by the resin were ionized in the same manner as so called cation paint.

Into the dispersion containing the ionized material powder therein, a copper wire as a substrate and a copper electrode as a counter electrode were immersed at spaced two positions. A direct current of 30 V was applied for 5 minutes between the substrate of copper wire and the counter electrode in such manner that the copper wire became a negative electrode while the counter electrode became a positive electrode.

Then, after the copper wire was taken out of the dispersion, the copper wire on which colloidal powders were fix was heated at 100° C. for 30 minutes to remove water and to evaporate the resin. After then, the resulting dried copper wire was sintered at 900° C. for 3 hours to obtain a superconductive wire.

Two pairs of electrodes of aluminium were vacuum-deposited on a sample (20 cm long) cut from the resulting superconductive wire and lead wires were soldered to the electrodes. The sample was immersed in liquidized hydrogen in a cryostat to cool the wire down to a temperature where no resistance was observed. Then, the temperature dependence of resistance of the sample was determined with rising the temperature gradually. The results revealed that the sample of wire exhibited superconductivity up to 70 K. and possessed the critical temperature of 93 K.

EXAMPLE 2

The dried copper wire which was prepared by the same procedure as Example 1 and which was not sintered yet was placed in a glass pipe and heat-treated by hot isostatic press (HIP) technique in which the copper wire was sintered at 800° C. for 24 hours under a pressure of 10 atm with pressurized gas of Ar containing 20% of oxygen.

The resulting sintered wire showed improvement in mechanical strength and adhesion between the superconducting surface layer and the substrate in comparison with an ordinary sintered product which was not subjected to the HIP treatment.

EXAMPLE 3

As a material powder, powders of $BaCO_3$, $Y_2O_3$ and CuO were prepared and were mixed in such an atomic ratio that Ba:Y:Cu became to 1:2:3. The resulting powder mixture was sintered at 950° C. and then pulverized by a ball mill to obtain a sintered compound oxide powder having an average particle size of less than 2 μm and having a chemical composition of $YBa_2Cu_3O_{7-\delta}$ in which δ is a number of $0 < \delta < 1$.

The sintered material powder obtained was mixed and kneaded with methacrylic acid type resin and then dispersed in a mixture of organic solvents consisting of ethanol and i-propanol (1:4) so that the colloidal powders surrounded by the resin were ionized in the same manner as so called cation paint.

Into the dispersion containing the ionized material powder therein, a stainless wire as a substrate and a stainless electrodes as a counter electrode were immersed at spaced two positions. A direct current of 100 V was applied for 5 minutes between the substrate of stainless wire and the counter electrode in such manner that the stainless wire became a negative electrode while the counter electrode became a positive electrode.

Then, after the stainless wire was taken out of the dispersion, a piece of the stainless wire on which colloidal powders were fix was dried in air to obtain a sample 1 while another piece thereof was heated at 200° C. for 30 minutes to remove water and to evaporate the resin to prepare a sample 2. After then, both of the samples 1 and 2 were sintered at 900° C. for 3 hours to obtain superconductive wires.

Two pairs of electrodes of aluminium were vacuum-deposited on each of the sample 1 and 2 (20 cm long) and lead wires were soldered to the electrodes. The samples were immersed in liquidized hydrogen in a cryostat to cool the wires down to a temperature where no resistance was observed. Then, the temperature dependence of resistance of the samples were determined with rising the temperature gradually. The results revealed that the sample 1 exhibited superconductivity up to 70K and possessed the critical temperature of 82 K., while the sample 2 exhibited superconductivity up to 82 K. and possessed the critical temperature of 92 K.

EXAMPLE 4

As a material powder, powders of $BaCO_3$, $Y_2(CO_3)_3$ and CuO were prepared and were mixed in a suitable proportion of Y/(Ba+Y) and compacted. The resulting compact was sintered at 800° C. and then pulverized by a ball mill to obtain a sintered compound oxide powder having an average particle size of less than 2 μm. It was determined by fluorescent X-ray method that the obtained sintered powder had a chemical composition of $YBa_2Cu_3O_7$.

Then, the sintered material powder obtained was mixed and kneaded with acrylamide type resin and then dispersed in water so that the colloidal powders surrounded by the resin were ionized like so called cation paint.

Into the dispersion containing the ionized material powder therein, a copper wire as a substrate and a copper electrodes as a counter electrode were immersed at spaced two positions. A direct current of 30 V was applied for 5 minutes between the substrate of copper wire and the counter electrode in such manner that the copper wire became a negative electrode while the counter electrode became a positive electrode.

Then, after the copper wire was taken out of the dispersion, the copper wire on which colloidal powders were fixed was heated at 100° C. for 30 minutes to remove water and to evaporate the resin. Then, the sample was sintered at 900° C. for 3 hours to obtain a superconductive wire.

Two pairs of electrodes of aluminium were vacuum-deposited on the sample (20 cm long) and lead wires were soldered to the electrodes. The sample was immersed in liquidized hydrogen in a cryostat to cool the wire down to a temperature where no resistance was observed. Then, the temperature dependence of resistance of the sample was determined with rising the temperature gradually. The result revealed that the sample exhibited superconductivity up to 85 K. and possessed the critical temperature of 92 K.

EXAMPLE 5

The dried copper wire which was prepared by the same procedure as Example 4 but which was not sintered yet was placed in a glass pipe and heat-treated by hot isostatic press (HIP) technique in which the copper wire was sintered at 800° C. for 24 hours under a pressure of 10 atm with pressurized gas of Ar containing 20% of oxygen.

The resulting sintered wire showed improvement in mechanical strength and adhesion between the surface superconducting layer and the substrate in comparison with an ordinary sintered product which was not subjected to the HIP treatment.

EXAMPLE 6

As a material powder, powders of $BaCO_3$ and $Y_2(CO_3)_3$ were prepared. A mixture of both powders were mixed and kneaded with acrylamide type resin and then dispersed in water so that the colloidal powders surrounded by the resin were ionized like so called cation paint.

Into the dispersion containing the ionized material powder therein, a copper wire as a substrate and a copper electrodes as a counter electrode were immersed at spaced two positions. A direct current of 30V was applied for 5 minutes between the substrate of copper wire and the counter electrode in such manner that the copper wire became a negative electrode while the counter electrode became a positive electrode.

Then, after the copper wire was taken out of the dispersion, the copper wire on which colloidal powders were fixed was heated at 100° C. for 30 minutes to remove water and to evaporate the resin. Then, the sample was sintered at 900° C. for 3 hours to obtain a superconductive wire.

Two pairs of aluminum electrodes were vacuum-deposited on the sample (20 cm long) and lead wires were soldered to the electrodes. The sample was immersed in liquidized hydrogen in a cryostat to cool the wire down to a temperature where no resistance was observed. Then, the temperature dependence of resistance of the sample was determined with rising the temperature gradually. The result revealed that the sample exhibited superconductivity up to 78 K. and possessed the critical temperature of 91 K.

EXAMPLE 7

The dried copper wire which was prepared by the same procedure as Example 6 but which was not sintered yet was placed in a glass pipe and heat-treated by hot isostatic press (HIP) technique in which the copper wire was sintered at 800° C. for 24 hours under a pressure of 10 atm with pressurized gas of Ar containing 20% of oxygen.

The resulting sintered wire showed improvement in mechanical strength and adhesion between the surface superconducting layer and the substrate in comparison with an ordinary sintered product which was not subjected to the HIP treatment.

EXAMPLE 8

As a material powder, powders of $BaCO_3$, $Y_2O_3$ and CuO were prepared and were mixed in such an atomic ratio that Ba:Y:Cu became to 1:2:3. The resulting powder mixture was sintered at 950° C. and then pulverized by a ball mill to obtain a sintered compound oxide powder having an average particle size of less than 2 μm.

A substrate made of $Al_2O_3$ and having a dimension of 30 mm×30 mm×3 mm was dipped in a hydrochloric acid aqueous solution containing stannous chloride so that a surface of the substrate is pretreated with the solution and then dipped in a hydrochloric acid aqueous solution containing silver chloride to deposit a thin silver film layer on the surface of the substrate by electroless plating technique.

The sintered material powder was mixed and kneaded with acrylamide type resin and then dispersed in a mixture of organic solvents consisting of ethylalcohol and propylalchohol (1:4) so that the colloidal powders surrounded by the resin were ionized in the same manner as so called cation paint.

Into the dispersion containing the ionized material powder therein, the abovementioned substrate having the thin silver film layer thereon as an electrode and a stainless electrodes as a counter electrode were immersed at spaced two positions. A direct current of 300 V was applied for 5 minutes between the alumina substrate and the counter electrode in such manner that the substrate became a negative electrode while the counter electrode became a positive electrode.

Then, after the substrate was taken out of the dispersion, the substrate having the silver layer thereon was heated to remove the solvent of water and to evaporate the carrier of acrylamide type resin. After then, the substrate was sintered at 900° C. for 3 hours to obtain a sample of superconducting alumina plate.

Two pairs of electrodes of gold were vacuum-deposited on the sample and the sample was immersed in liquidized nitrogen in a cryostat to cool the sample down to a temperature where no resistance was observed. Then, the temperature dependence of resistance of the samples were determined by conventional four probe method with rising the temperature gradually. The results revealed that the sample exhibited superconductivity up to 85 K. and possessed the critical temperature of 93 K.

What we claim are:

1. A process for producing a high temperature superconducting article having a layer of superconducting compound oxide on a substrate characterized by the steps comprising dispersing at least one of material powders selected from a group consisting of:

(i) a powder mixture consisting of elements which are constituent elements of said superconducting compound oxide;

(ii) a powder mixture of compounds each containing at least one of said constituent elements; and (iii) a sintered powder of compound oxide prepared by sintering a powder mixture of (i) and/or (ii) in an oxygen-containing atmosphere and by pulverizing the obtained sintered body;

in a liquid in which a carrier is fixed on said material powders, applying a direct current between said substrate and a counter electrode, both of which are immersed in said liquid, to deposit charged powders on a surface of said substrate, taking said substrate having a layer of deposited powders out of said liquid, heating said substrate to remove said carrier, and then sintering said layer of powders deposited on said substrate in an oxygen-containing atmosphere to convert the powders to said superconducting compound oxide; and wherein the atomic ratios of the elements in said material powders are adjusted to the same value as an atomic ratio of constituent elements in said superconducting compound oxide to be produced in an oxygen-containing atmosphere.

2. A process set forth in claim 1, wherein said compound oxide is of quasi-perovskite type oxide.

3. The process set forth in claim 1, wherein each of said compounds is an oxide powder or carbonate powder comprising each of the constituent elements of said superconducting compound oxide.

4. A process set forth in claim 1, wherein said material powders have an average particle size of less than 40 μm.

5. The process set forth in claim 1 wherein said substrate has a form of a shaped wire.

6. A process set forth in claim 1, wherein said substrate is made of metal.

7. A process set forth in claim 1, characterized in that said substrate is a carbon fiber.

8. A process set forth in claim 1, wherein said carrier is polycarbonic acid type resin or polyamine type resin latex.

9. A process set forth in claim 1, wherein the removal of said carrier is performed by heating the deposited layer at a temperature ranging from 300° C. to 500° C.

10. A process set forth in claim 1, wherein said liquid is shaken, vibrated or revolved during the electrodeposition of said ionized powders onto said substrate.

11. A process set forth in claim 1, wherein said sintering is carried out at a temperature ranging from 900° C. to 1,100° C.

12. A process set forth in claim 1, wherein, after the removal of the carrier, a composite comprising said substrate and said layer of sintered compound oxide is subjected to hot isostatic press at a temperature ranging from 200° C. to 1,100° C. under a pressure ranging from 5 to 2,000 atm.

13. A process set forth in claim 1, wherein a thin buffer layer is disposed at an interface between said substrate and said compound oxide layer.

14. The process set forth in claim 13 wherein said buffer layer consists of one of metals selected from a group consisting of Au, Ag and Pt.

15. The process set forth in claim 14 wherein said metal layer is formed by electroless plating technique.

16. A process set forth in claim 1, wherein said substrate is of non electroconductive material.

17. The process set forth in claim 1 wherein said compound oxide is a compound oxide including an element α selected from IIa group of the Periodic Table, an element β selected from IIIa group of the Periodic Table and Cu.

18. The process set forth in claim 17 wherein said element α is Ba and said element β is Y.

19. The process set forth in claim 17 wherein said element α is Ba and said element β is La.

20. The process set forth in claim 17 wherein said element α is Sr and said element β is La.

21. The process set forth in claim 1 wherein said compound oxide is a compound oxide including at least two elements α1 and α2 selected from IIa group of the Periodic Table, an element δ selected from Va group of the Periodic Table and Cu.

22. The process set forth in claim 21 wherein said elements α1 and α2 are Sr and Ca, and said element δ is Bi.

23. The process set forth in claim 1 wherein said compound oxide is a compound oxide including at least two elements α1 and α2 selected from IIa group of the Periodic Table, an element ε selected from IIIa group of the Periodic Table and Cu.

24. The process set forth in claim 23 wherein said elements α1 and α2 are Ba and Ca, and said element δ is Tl.

25. The process set forth in claim 1 wherein said layer is composed of a compound oxide represented by the general formula:

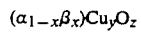

$(\alpha_{1-x}\beta_x)Cu_yO_z$ in which α stands for an element selected from IIa group of the Periodic Table, β stands for an element selected from IIIa group of the Periodic Table, and a small letter of "x" represents an atomic ratio of β and is a number which satisfies a range of $0.1 \leq x \leq 0.9$ with respect to the total of $(\alpha+\beta)$ which is considered to be equal to 1, small letters of "y" and "z" represent atomic ratios of Cu and oxygen (O) respectively and satisfy ranges of $0.4 \leq y \leq 3.0$ and $1 \leq z \leq 5$ respectively, characterized by the steps comprising preparing at least one material powder selected from a group consisting of (i) a powder mixture of elements α, β and Cu,;

(ii) a powder of compounds each containing at least one of said elements of α, β and Cu; and (iii) a sintered powder of compound oxide prepared by sintering said powder mixture of (i) and/or (ii) and then by pulverizing obtained sintered body, wherein, atomic ratios of the elements in said material powders (i), (ii) and (iii) are adjusted to the same value as atomic ratios of constituent elements in said superconducting compound oxide to be produced, dispersing said material powder in a liquid containing a carrier which is fixed on said powders, applying a direct current between an electroconductive substrate and counter electrode both of which are immersed in said liquid to deposit charged powders on a surface of said substrate, taking said substrate out of said liquid to remove said carrier, and then sintering a layer of powders deposited on said substrate to convert the powders to said superconducting compound oxide.

26. The process set forth in claim 25 wherein each of said compounds is an oxide powder of carbonate powder each containing at least one of said elements $\alpha$, $\beta$ and Cu.

27. A process set forth in claim 25, wherein said substrate is in a form of shaped wire.

28. A process set forth in claim 25, wherein said substrate is made of metal.

29. A process set forth in claim 25, wherein said substrate is a carbon fiber.

30. A process set forth in claim 25, wherein said carrier is polycarbonic acid type resin or polyamine type resin latex.

31. A process set forth in claim 25, wherein the removal of said carrier is performed by heating the deposited layer at a temperature ranging from 300° C. to 500° C.

32. A process set forth in claim 25, wherein said liquid is shaken, vibrated or revolved during the deposition of said ionized powders onto said substrate.

33. A process set forth in claim 25, wherein said sintering is carrier out at a temperature ranging from 900° C. to 1,100° C.

34. A process set forth in claim 25, wherein, after the removal of the carrier, a composite of said substrate and said layer of compound oxide deposited thereon is subjected to hot isostatic press at a temperature ranging from 200° C. to 1,100° C. under a pressure ranging from 5 to 2,000 atm.

35. The process set forth in claim 25 wherein said element $\alpha$ is Ba and said element $\beta$ is Y.

36. The process set forth in claim 25 wherein said element $\alpha$ is Ba and said element $\beta$ is La.

37. The process set forth in claim 25 wherein said element $\alpha$ is Sr and said element $\beta$ is La.

38. The process set forth in claim 25 wherein said material powder of compound oxide is prepared by the steps comprising sintering the mixture of oxide powders or carbonate powders of the elements $\alpha$, $\beta$ and Cu or/and compound oxide powders or compound carbonate powders each containing at least two of the elements $\alpha$, $\beta$ Cu at a temperature ranging from 250° C. to 1,200° C. to prepare a sintered body and then pulverizing the sintered body obtained.

39. The process set forth in claim 38 wherein said sintering is carried out at a temperature ranging from the upper limit which is a melting point of said compound oxide to a temperature which is lower than said melting point by 100° C.

40. A process set forth in claim 1, wherein said liquid is non-aqueous solvent.

41. A process set forth in claim 40, wherein said solvent is dimethylformaldehyde (DMF), acetonitryl (AN) or alcohols.

42. A process set forth in claim 40, wherein said carrier is methacryl resin type latex.

43. A process set forth in claim 40, wherein said sintering is carrier out at a temperature ranging from 600° C. which is the lower limit to a melting point of any one of said powders having lowest melting point which is the upper limit.

44. A process for producing a superconducting article having a layer of compound oxide represented by the general formula:

$$(\alpha_{1-x}\beta_x)Cu_yO_z$$

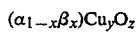

in which $\alpha$ stand for an element selected from IIa group of the Periodic Table, $\beta$ stands for an element selected from IIIa group of the Periodic Table, a small letter of "x" represents an atomic ratio of $\beta$ and is a number which satisfies a range of $0.1 \leq x \leq 0.9$ with respect to the total of $(\alpha+\beta)$ which is considered to be equal to 1, small letters of "y" and "z" represent atomic ratios of Cu and oxygen (O) respectively and satisfy ranges of $0.4 \leq y \leq 3.0$ and $1 \leq z \leq 5$ respectively, characterized by the steps comprising perparing at least one material powder selected from a group consisting of:

(i) a powder mixture of elements $\alpha$ and $\beta$;
(ii) a powder of compounds each containing at least one of said elements of $\alpha$ and $\beta$; and
(iii) a sintered powder of compound oxide prepared by sintering said powder mixture of (i) and/or (ii) in an oxygen-containing atmosphere and then by pulverizing obtained sintered body, wherein, atomic ratios of the elements $\alpha$ and $\beta$ in said material powders (i), (ii) and (iii) are adjusted to the same value as atomic ratios of constituent elements in said superconducting compound oxide to be produced, dispersing said material powder in a liquid containing a carrier which is fixed on said powders, applying a direct current between an electroconductive substrate which contains Cu and a counter electrode both of which are immersed in said liquid to deposit charged powders of $\alpha$ and $\beta$ onto a surface of said substrate containing Cu, taking the substrate out of said liquid to remove said carrier, and then sintering said layer of deposited powders to convert the powders to said compound oxide in an oxygen-containing atmosphere.

45. A process set forth in claim 44, wherein said electroconductive substrate is a copper wire.

46. A process set forth in claim 44, wherein said compound oxide is of quasi-perovskite type oxide.

47. A process set forth in claim 44, wherein said powder of compounds is an oxide powder and/or a carbonate powder of said elements $\alpha$ and $\beta$ or/and a compound oxide powder or a compound carbonate powder containing $\alpha$ and $\beta$.

48. A process set forth in claim 44, wheein said material powder have an average particle size of less than 40 $\mu$m.

49. A process set forth in claim 44, wherein said carrier is polycarbonic acid type resin or polyamine type resin latex.

50. A process set forth in claim 44, wherein the removal of said carrier is performed by heating the deposited layer at a temperature ranging from 300° C. to 500° C.

51. A process set forth in claim 44, wherein said liquid is shaken, vibrated or revolved during the deposition of said ionized powders onto said substrate.

52. A process set forth in claim 44, wherein said sintering is carried out at a temperature ranging from 900° C. to 1,100° C.

53. A process set forth in claim 44, wherein, after the removal of the carrier, a composite of said substrate and said layer of compound oxide deposited thereon is subjected to hot isostatic press at a temperature ranging from 200° C. to 1,100° C. under a pressure ranging from 5 to 2,000 atm.

54. The process set forth in claim 44 wherein said element $\alpha$ is Ba, and said element $\beta$ is Y.

55. The process set forth in claim 44 wherein said element $\alpha$ is Ba, and said element $\beta$ is La.

56. The process set forth in claim 44 wherein said element $\alpha$ is Sr, and said element $\beta$ is La.

57. The process set forth in claim 44 wherein said compound oxide is a compound oxide including at least two elements $\alpha 1$ and $\alpha 2$ selected from IIa group of the Periodic Table, an element $\delta$ selected from Va group of the Periodic Table and Cu.

58. The process set forth in claim 57 wherein said elements $\alpha 1$ and $\alpha 2$ are Sr and Ca and said element $\delta$ is Bi.

59. The process set forth in claim 44 wherein said compound oxide is a compound oxide including at least two elements $\alpha 1$ and $\alpha 2$ selected from IIa group of the Periodic Table, an element $\epsilon$ selected from IIIa group of the Periodic Table and Cu.

60. The process set forth in claim 59 wherein said elements $\alpha 1$ and $\alpha 2$ are Ba and Ca and said element $\epsilon$ is Tl.

* * * * *